US008009712B2

(12) United States Patent
Osinski et al.

(10) Patent No.: US 8,009,712 B2
(45) Date of Patent: Aug. 30, 2011

(54) LIGHT-EMITTING DEVICE HAVING INJECTION-LOCKABLE SEMICONDUCTOR RING LASER MONOLITHICALLY INTEGRATED WITH MASTER LASER

(75) Inventors: Marek A. Osinski, Albuquerque, NM (US); Omar K. Qassim, Albuquerque, NM (US); Nathan J. Withers, Albuquerque, NM (US); Gennady A. Smolyakov, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 12/460,892

(22) Filed: Jul. 24, 2009

(65) Prior Publication Data
US 2010/0034223 A1 Feb. 11, 2010

Related U.S. Application Data

(63) Continuation-in-part of application No. 12/387,714, filed on May 6, 2009, now abandoned.

(60) Provisional application No. 61/126,918, filed on May 7, 2008.

(51) Int. Cl.
H01S 5/00 (2006.01)
H01S 3/083 (2006.01)
(52) U.S. Cl. .................. 372/44.01; 372/43.01; 372/50.1; 372/94
(58) Field of Classification Search .............. 372/92–94, 372/43.1, 44.01, 50.1
See application file for complete search history.

(56) References Cited

U.S. PATENT DOCUMENTS

| 5,031,190 | A | * | 7/1991 | Behfar-Rad | 372/94 |
| 5,132,983 | A | * | 7/1992 | Behfar-Rad | 372/94 |
| 6,792,025 | B1 | * | 9/2004 | Behfar et al. | 372/94 |
| 6,937,342 | B2 | * | 8/2005 | Osinski et al. | 356/461 |
| 2003/0030814 | A1 | * | 2/2003 | Osinski et al. | 356/461 |

OTHER PUBLICATIONS

C. H. Chang, et al., "Injection locking of VCSELs", IEEE J. Sel. Top. Quantum Electron., vol. 9, No. 5, pp. 1386-1393, Sep./Oct. 2003.
H. F. Chen, et al., "Response characteristics of direct current modulation on a bandwidth-enhanced semiconductor laser under strong injection locking", Opt.Commun., vol. 173, pp. 349-355, 2000.
L. Chrostowski, et al., "Injection-locked 1.55μm VCSELs with enhanced spur-free dynamic range", Electron. Lett. 38, No. 17, pp. 965-967, Aug. 2002.
L. Chrostowski, et al., "Enhancement of dynamic range in 1.55μm VCSELs using injection locking", IEEE Photon. Technol. Lett., vol. 15, No. 4, pp. 498-500, Apr. 2003.
L. Chrostowski, et al., "50-GHz optically injection-locked 1.55μm VCSELs", IEEE Photon. Thechnol. Lett., vol. 18, pp. 376-369, Jan.-Feb. 2006.
L. Chrostowski, et al., "Microwave performance of optically injection-locked VCSELs", IEEE Trans. Microw. Theory Tech. vol. 54, pp. 788-796, Feb. 2006.
H. Y. Chung, et al., "Modeling and optimization of traveling-wave LiNbO$_3$ interferometric modulators", IEEE J. Quantum Electron. vol. 27, No. 3, pp. 608-617, Mar. 1991.

(Continued)

Primary Examiner — Jessica Stultz
Assistant Examiner — Phillip Nguyen

(57) ABSTRACT

A semiconductor ring laser (SRL) section is monolithically integrated with a DFB or DBR master laser section on a semiconductor substrate of a light-emitting device to provide an injection locking mode of operation that can result in low-cost ultrafast (over 100 GHz) functional chip that will be easy to use in practice.

33 Claims, 5 Drawing Sheets

OTHER PUBLICATIONS

C. H. Cox, et al., "Limits on the performance of RF-over-fiber links and their impact on device design", IEEE Trans. Microw. Theory Tech., vol. 54, pp. 906-920, Feb. 2006.

G. K. Golpalakrishnan, et al., "Performance and modeling of resonantly enhanced $LiNbO_3$ modulators for low-loss analog links", IEEE Trans. Microw. Theory Tech., vol. 42, pp. 2650-2656, Dec. 1994.

C. H. Henry, et al., "Locking range and stability of injection locked 1.54μm InGaAsP semiconductor lasers", IEEE J. Quantum Electron. vol. 21, pp. 1152-1156, 1985.

S. K. Hwang, et al., "35-GHz intrinsic bandwidth for direct modulation in 1.3-μm semiconductor lasers subject to strong injection locking", IEEE Photon. Technol. Lett. vol. 16, pp. 972-974, Apr. 2004.

X. M. Jin, et al., "Bandwidth enhancement of Fabry-Perot quantum-well lasers by injection-locking", Solid-State Electron. vol. 50, pp. 1141-1149, Jun. 2006.

R. J. Jones, et al., "Influence of detuned injection locking on the relaxation oscillation frequency of a multimode semiconductor laser", J. Mod. Opt., vol. 47, pp. 1977-1986, Sep. 2000.

O. Kjebon, et al., "30 GHz direct modulation bandwidth in detuned loaded InGaAsP lasers at 1.55μm wavelength", Electron. Lett. vol. 33, pp. 488-489, Mar. 1997.

R. Lang, et al., "Suppression of the relaxation oscillation in the modulated output of semiconductor lasers", IEEE J. Quantum Electron. vol. 12, pp. 194-199, Mar. 1976.

R. Lang, "Injection locking properties of a semiconductor laser", IEEE J. Quantum Electron, vol. 18, pp. 976-983, 1982.

K. Y. Lau, et al., "Intermodulation distortion in a directly modulated semiconductor injection laser", Appl. Phys. Lett., vol. 45, pp. 1034-1036, 1984.

K. Y. Lau, et al., "Ultra-high speed semiconductor lasers", IEEE J. Quantum Electron., vol. 21, pp. 121-138, 1985.

E. K. Lau, et al., "Scaling of resonance frequency for strong injection-locked lasers", Optics Lett., pp. 3373-3375, Dec. 2007.

E. K. Lau, et al., "Frequency response enhancement of optical injection-locked lasers", IEEE J. Quantum Electron., vol. 44, pp. 90-99, Jan. 2008.

E. K. Lau, et al., "Strong optical injection-locked semiconductor lasers demonstrating > 100-GHz resonance frequencies and 80-GHz intrinsic bandwidths", Opt. Express, vol. 16, pp. 6609-6618, Apr. 2008.

K. L. Lear, et al., "High-speed vertical cavity surface emitting lasers", in Proc. IEEE/LEOS Summer Topical Meetings, pp. 53-54, 1997.

M. Lee, et al., "Broadband modulation of light by using an electro-optic polymer", Science 298, pp. 1401-1403, Nov. 15, 2002.

H. Li, et al., "Injection locking dynamics of vertical cavity semiconductor lasers under conventional and phase conjugate injection", IEEE J. Quantum Electron, pp. 227-235, Feb. 1996.

J.M. Liu, et al., "Modulation bandwidth, noise, and stability of a semiconductor laser subject to strong injection locking", IEEE Photon. Technol., Lett. 9, pp. 1325-1327, Oct. 1997.

J.-M. Luo, et al., "Side-mode injection locking characteristics of semiconductor lasers: Multimode analysis", Proc. 1st International Workshop on Photonic Networks, Components and Applications (J. Chrostowski and J. Terry, Eds.), Montebello, Quebec, Canada, Oct. 11-13, 1990, Series in Optics and Photonics vol. 2, World Scientific, Singapore 1991, pp. 195-199.

J.-M. Luo, et al., "Stable-locking bandwidth in sidemode injection locked semiconductor lasers", Electron. Lett. 27, pp. 1737-1739, Sep. 12, 1991.

J.-M. Luo, et al., "Multimode small-signal analysis of side-mode injection-locked semiconductor lasers", Jpn. J. Appl. Phys. Pt.2 (Lett.) 31, pp. L685-L688, Jun. 1992.

Y. Matsui, et al., "30-GHz bandwidth 1.55-μm strain-compensated InGaAlAs-InGaAsP MQW laser", IEEE Photonics Technol. Lett. 9, pp. 25-27, Jan. 1997.

X. J. Meng, et al., "Experimental demonstration of modulation bandwidth enhancement in distributed lasers with external light injection", Electron. Lett. 34, pp. 2031-2032, Oct. 15, 1998.

X. J. Meng, et al., "Improved intrinsic dynamic distortions in directly modulated semiconductor lasers by optical injection locking", IEEE Trans. Microw. Theory Tch. 47, pp. 1172-1176, Jul. 1999.

F. Mogensen, et al., "Locking conditions and stability properties for a semiconductor laser with external light injection", IEEE J. Quantum. Electron. 21, pp. 784-793, 1985.

S. Mohrdiek, et al., "Chirp reduction of directly modulated semiconductor lasers at 10 Gb/s by strong CW light injection", J. Lightwave Technol.12 pp. 418-424, Mar. 1994.

A. Murakami, et al., "Cavity resonance shift and bandwidth enhancement in semiconductor lasers with strong light injection", IEEE J. Quantum Electron. 39, pp. 1196-1204, Oct. 2003.

M. Nizette, et al., "Averaged equations for injection locked semiconductor lasers", Physica D 161, pp. 220-236, Jan. 2002.

M. Nizette, et al., "Stability and bifurcations of periodically modulated, optically injected laser diodes", Phys. Rev. E 63, Art.026212, Feb. 2001.

K. Noguchi, et al., "Millimeter-wave $Ti:LiNbO_3$ optical modulators", J. Lightwave Technol. 16, pp. 615-619, Apr. 1998.

Y. Okajima, et al., "Experimental observation of chirp reduction in bandwidth-enhanced semiconductor lasers subject to strong optical injection", Opt.Commun.219, pp. 357-364, Apr. 15, 2003.

F. Pozzi, et al., "Dual-wavelength InAlGaAs-InP laterally coupled distributed feedback laser", IEEE Photonics Technol. Lett. 18, pp. 2563-2565, Nov.-Dec. 2006.

N. Schunk, et al., "Noise analysis of injection-locked semi-conductor injection lasers", IEEE J. Quantum Electron. 22, pp. 642-650, May 1986.

T. B. Simpson, et al., "Bandwidth enhancement and broadband noise reduction in injection-locked semiconductor lasers", IEEE Photon. Technol. Lett. 7, pp. 709-711, Jul. 1995.

T. B. Simpson, et al., "Small-signal analysis of modulation characteristics in a semiconductor laser subject to strong optical injection", IEEE J. Quantum Electron.32, pp. 1456-1468, Aug. 1996.

T. B. Simpson, et al., "Enhanced modulation bandwidth in injection-locked semiconductor lasers", IEEE Photonics Technol. Lett. 9, pp. 1322-1324, Oct. 1997.

M. B. Spenser, et al., "Laser with a transmitting window", Phys. Rev. A5, pp. 884-892, 1972.

H.-K. Sung, et al., "Modulation bandwidth enhancement and nonlinear distortion suppression in directly modulated monolithic injection-locked DFB lasers", in MWP 2003 Proc. International Topical Meeting on Microwave Photonics, pp. 27-30, 2004.

S. Wieczorek, et al., "Improved semiconductor-laser dynamics from induced population pulsation", IEEE J. Quantum Electron. 42, pp. 552-562, May-Jun. 2006.

E. Wong, et al., "Optically injection-locked 1.55μm VCSELs as upstream transmitters in WDM-PONs", IEEE Photon. Technol. Lett. 18, pp. 2371-2373, Nov.-Dec. 2006.

X. Zhao, et al., "28 GHz optical injection-locked 1.55μm VCSELs", Electron. Lett. 40, pp. 476-478, Apr. 15, 2004.

X. Zhao, et al., "High extinction ration of injection-locked 1.55μm VCSELs", IEEE Photon. Technol. Lett. 18, pp. 166-168, Jan.-Feb. 2006.

X. Zhao, et al., "Novel cascaded injection-locked 1.55μm VCSELs with 66 GHz modulation bandwidth", Opt. Express 15, pp. 14810-14816, Oct. 29, 2007.

* cited by examiner

US 8,009,712 B2

LIGHT-EMITTING DEVICE HAVING INJECTION-LOCKABLE SEMICONDUCTOR RING LASER MONOLITHICALLY INTEGRATED WITH MASTER LASER

RELATED APPLICATION

This is a continuation-in-part application of Ser. No. 12/387,714 filed May 6, 2009, now abandoned which claims benefits of provisional application Ser. No. 61/126,918 filed May 7, 2008, the disclosures of both of which are incorporated herein by reference.

FIELD OF THE INVENTION

The present invention relates to semiconductor light-emitting laser devices and, in particular, to an injection-lockable semiconductor ring laser monolithically integrated with a DBR or DFB semiconductor laser to improve ultrahigh frequency performance of semiconductor light-emitting laser devices for both digital and analog applications.

BACKGROUND OF THE INVENTION

A. Direct Modulation vs. External Modulation of Semiconductor Laser Output

The continuing increase of transmission rates at all levels of telecommunication networks and fiber-based RF photonic systems raises demand for very high-speed, low cost optical transmitters. Much effort has been put into developing wide-bandwidth lasers and modulators over the past ten years. To date, the largest reported bandwidth of directly modulated free-running semiconductor lasers at 1.55 μm is 30 GHz, as measured in a Fabry-Perot edge-emitting buried-heterostructure multiple-quantum-well (MQW) laser [Matsui 1997] and in a DFB laser [Kjebon 1997]. On the other hand, external modulators operating at speeds of 40 Gb/s are currently available commercially [Covega 2008] and modulators operating at speeds in the 100-GHz range are under development [Chang 2002]. The widest reported 3-dB modulation bandwidth for Ti:LiNbO$_3$ electro-optic (EO) modulators is 70 GHz, with the maximum measured frequency of 110 GHz [Noguchi 1998]. The drawback of the Ti:LiNbO$_3$ modulators, however, is their poor sensitivity, as represented by their unattractively high half-wave voltage $V_\pi$. Very high modulation frequency and broad-band performance of the Ti:LiNbO$_3$ modulators come at the expense of too high $V_\pi$, which makes them less attractive for system applications [Cox 2006]. A very impressive 145 GHz modulation bandwidth has been demonstrated for a PMMA/DR1 polymer EO modulator at 1310 nm [Lee 2002]. However, the technology of polymer modulators is still very immature, with most of the development effort being focused on the polymer material itself. In general, the polymers with larger EO effect are the least stable against temperature and optical power, which casts doubt on long-term stability of polymer materials [Cox 2006]. In addition, the frequency response of any EO modulator is typically determined by the electrode RF propagation loss and the phase mismatch between the optical beam and modulation microwave [Chung 1991], [Gopalakrishnan 1994], [Chang 2002], which makes overall design and fabrication of these devices complex and costly. Therefore, low-cost small-size directly modulated laser sources with very high modulation bandwidths exceeding 100 GHz are still highly desirable for the rapidly growing applications of RF optical fiber links, and could revolutionize the future of optical telecommunication.

B. Enhancement of Modulation Bandwidth in Injection-Locked Semiconductor Lasers Since their inception, semiconductor lasers have been key components for many applications in optical fiber communication because of their excellent spectral and beam properties and capability to be directly modulated at very high rates. However, their frequency response has limited the commercial use of directly-modulated lasers to digital transmission not exceeding 10 Gb/s. The modulation response of a diode laser is determined by the rate at which the electrons and holes recombine in the active region (spontaneous carrier lifetime $\tau_{sp}$), and the rate at which photons can escape from the laser cavity (photon lifetime $\tau_p$). The modulation bandwidth is limited by the relaxation oscillation frequency $f_{RO}$ of the laser given by [Lau 1985]

$$2\pi f_{RO} = \sqrt{g_N \gamma_p P_0}, \quad (1)$$

where $g_N$ is the differential optical gain, $P_0$ is the average photon number in the laser cavity, and $\gamma_p$ is the photon decay rate given by the reciprocal of $\tau_p$. Eq. (1) suggests that the relaxation oscillation frequency can be increased by proper design of laser parameters to get either higher photon density or shorter photon lifetime. Increased injection currents for higher $P_0$ values and shorter laser cavities for smaller $\tau_p$ are ordinarily employed for that purpose in diode lasers. Both approaches, however, involve higher injection current densities, which could result in optical damage to the laser facets and excessive heating. Safe levels of injection current therefore limit the modulation bandwidth in semiconductor lasers. To date, the highest reported experimental relaxation oscillation frequency for a solitary edge-emitting laser is ~24.5 GHz [Matsui 1997], and ~15 GHz for a vertical-cavity surface emitting laser (VCSEL) [Lear 1997].

Optical injection locking has been shown to be an extremely effective method to improve microwave performance and linearity of diode lasers and to reach beyond the record values of $f_{RO}$ achieved for free-running devices. Injection locking was first demonstrated in 1976 using edge-emitting lasers [Kobayashi 1976], and in 1996 for VCSELs [Li 1996]. The technique uses output of one laser (master) to optically lock another laser (slave), which can still be directly modulated. Significant increase in the resonance frequency and modulation bandwidth, with reduction in nonlinear distortions [Meng 1999] and frequency chirp [Mohrdiek 1994] has been achieved by injecting external light into diode lasers. So far, improved microwave performance has been observed in edge-emitting lasers with Fabry-Perot cavity [Simpson 1995], [Simpson 1997], [Jin 2006], distributed feedback (DFB) lasers [Meng 1998], [Hwang 2004], [Sung 2004], [Lau 2008b], and VCSELs [Chrostowski 2002], [Chrostowski 2003], [Okajima 2003], [Chang 2003], [Zhao 2004], [Zhao 2006], [Chrostowski 2006a], [Chrostowski 2006b], [Wong 2006], [Lau 2008b]. The highest experimentally observed $f_{RO}$ in excess of 100 GHz was reported for injection-locked DFB lasers and VCSELs, with a record 3-dB bandwidth of 80 GHz being achieved in injection-locked VCSELs [Lau 2008b].

Many aspects of the injection-locking experimental results have been reproduced in analytical studies [Luo 1991], [Simpson 1996], [Nizette 2002], [Nizette 2003], [Lau 2007], [Lau 2008a] and numerical simulations using rate equation models [Luo 1990], [Luo 1992a], [Luo 1992b], [Liu 1997], [Jones 2000], [Chen 2000], [Murakami 2003], [Wieczorek 2006]. Dynamic behavior of diode lasers is described by a system of coupled nonlinear differential equations for the optical field and carrier density in the laser cavity. While for a free-running laser these equations exhibit only damped oscillations with corresponding relaxation oscillation frequency and damping rate, external optical injection increases the number of degrees of freedom by one, which leads to a much greater variety of dynamic behavior. In particular, perturbation analysis of rate equations [Simpson 1996], [Simpson 1997] revealed that the enhanced resonance frequency (the peak frequency in the modulation spectrum) was identical to the difference between the injected light frequency and a shifted cavity resonance, which agreed well with experimental observations. The physical mechanism behind this effect was further clarified in [Murakami 2003], [Wieczorek 2006]. Under strong optical injection, a beating between the injected light frequency and the cavity resonant frequency dominates the dynamic behavior.

FIG. 1 presents a simple illustration of cavity effects and emission frequency in an injection-locked single-mode semiconductor laser. The optical gain spectrum and longitudinal mode spacing are assumed to be sufficiently broad to cover the frequency range of interest. A positive detuning $\Delta\omega_{inj}=\omega_{inj}-\omega_0$ is assumed between the resonant angular frequency $\omega_0$ of a solitary (free-running) laser and the angular frequency $\omega_{inj}$ of the injected field (FIG. 1a). When the laser is in steady state and locked (FIG. 1b), it emits all its power at the injected frequency $\omega_{inj}$. The cavity resonance, however, must shift to lower frequency by $\Delta\omega(N)$, because the refractive index of the active medium increases with the carrier density decrease, and the carrier density N is reduced below its uninjected threshold value due to optical injection. The shift in the carrier-dependent cavity resonance $\Delta\omega$ is given by [Lang 1982], [Mogensen 1985]:

$$\Delta\omega(N) = \frac{\alpha}{2} v_{g,eff} \Delta G(N) = \frac{\alpha}{2} v_{g,eff} G_N \Delta N, \qquad (2)$$

$$(\Delta N = N - N_{th}),$$

with α—the linewidth broadening factor, $v_{g,eff}$—the effective group velocity, $N_{th}$—the threshold carrier density, and G—the modal gain, assumed to vary linearly with the carrier density $G(N)=G_N(N-N_0)$, where $G_N$ is the differential modal gain and $N_0$ is the transparency carrier density. In steady state, the gain is too small to support the shifted-frequency mode, and lasing can occur only at the locked frequency $\omega_{inj}$, provided $\omega_{inj}-\omega_{shift}$ remains within the stable locking range. In the transient process, however, the gain may become sufficient to sustain a mode at the shifted cavity resonance $\omega_{shift}$. Thus, under modulation conditions, the slave laser output may exhibit a damped oscillation at the beat frequency $\omega_{inj}-\omega_{shift}$ due to interference between those two fields. According to Eq. (2), the resonant frequency produced by this transient interference is given by $$\omega_{res} = \Delta\omega_{inj} - \Delta\omega(N) = \Delta\omega_{inj} - \frac{\alpha}{2} v_{g,eff} G_N \Delta N. \qquad (3)$$

The most comprehensive study of the modification of dynamical properties of a semiconductor laser by a strong injected signal was reported in [Wieczorek 2006]. Bifurcation theory and continuation techniques were used to explore a wide range of experimental situations involving different injection conditions and types of lasers. The following system of coupled rate equations for injection-locked diode lasers was found to reproduce adequately many aspects of modulation-bandwidth enhancement found experimentally in injection-locked VCSELs:

$$\frac{dE}{dt} = \frac{1}{2}\Gamma v_{g,eff} g_N(N - N_{th})E + \kappa E_{inj}\cos\varphi, \qquad (4)$$

$$\frac{d\varphi}{dt} = 2\pi\Delta - \frac{\alpha}{2}\Gamma v_{g,eff} g_N(N - N_{th}) - \kappa\frac{E_{inj}}{E}\sin\varphi, \qquad (5)$$

$$\frac{dN}{dt} = \frac{j_{mod}}{ed} - \gamma_N N - \frac{\varepsilon_0 n_{g,eff} c}{2h\nu}[g_{th} + g_N(N - N_{th})]E^2, \qquad (6)$$

where E is the intracavity electric field amplitude, φ is the phase difference between the injected and intracavity fields, Γ is the optical confinement factor, κ is the coupling rate coefficient, $E_{inj}$ is the amplitude of the injected field incident upon the slave cavity, Δ is the detuning between injected and free-running laser frequencies, $j_{mod}$ is the modulated pumping current density, e is the electron charge, d is the active region thickness, $\gamma_N$ is the electron population decay rate, $\epsilon_0$ is the permittivity of vacuum, $n_{g,eff}$ is the effective group index, h is Planck's constant, ν is the frequency of the intracavity field, and $g_{th}$ is the threshold gain. Injection of a coherent field, with amplitude $E_{inj}$ and frequency $\nu_{inj}$, introduces driving terms in the laser field equations, as shown in Eqs. (4), (5) [Spencer 1972]. The threshold gain and carrier density in a free-running laser are $$g_{th} = \frac{n_{g,eff}\gamma_p}{c\Gamma}; \quad N_{th} = N_0 + \frac{n_{g,eff}\gamma_p}{c\Gamma g_N}. \qquad (7)$$

For sinusoidal modulation, the pumping current density $j_{mod}$ in Eq. (6) can be written as $$j_{mod}=j_0[1+\delta\sin(2\pi ft)], \qquad (8)$$

where $j_0$ is the pre-bias current density, δ is the modulation depth, and f is the modulation frequency. Eqs. (4)-(6) assume single-mode operation, typical for VCSELs or DFB lasers. No theoretical limitation has been found for further increase in the relaxation oscillation frequency $f_{RO}$. It should be noted, however, that a higher $f_{RO}$ does not necessarily imply a broader modulation bandwidth. A large relaxation oscillation damping rate $\gamma_{RO}$ can undermine the ability of the laser to respond to fast modulation. Hence, a combination of high $f_{RO}$ and low $\gamma_{RO}$ is required for a broad modulation bandwidth. In practice, directly modulated lasers often suffer from high distortions near the resonance frequency $f_{RO}$, which makes them useful only at RF frequencies much lower than $f_{RO}$ [Lau 1984]. A common practice to increase $f_{RO}$ is to pump the laser high above threshold. However, $f_{RO}$ and $\gamma_{RO}$ are linked in a free-running laser, so any increase in $f_{RO}$ is accompanied by a greater increase in $\gamma_{RO}$. One very important finding of [Wieczorek 2006] is that coherent optical injection can be used to break that link. For some combinations of injection strength and detuning, $f_{RO}$ can be made to increase, while $\gamma_{RO}$ can remain constant or even slightly decrease.

Another factor limiting modulation bandwidth in injection-locked lasers, evident in all strong-injection-locking experiments, is a sharp roll-off of their modulation response that occurs at low modulation frequencies, before the modulation response gets enhanced by the resonance frequency. The cause of this "sagging" low-frequency response has recently been identified [Lau 2008a] as decoupling of the carrier injection rate from the relaxation oscillation dynamics under strong injection conditions. The cut-off frequency of the low-frequency roll-off can be approximated as [Lau 2008a]:

$$\omega_p \approx \left[1 + \omega_{res}^{-2}\alpha\gamma_p\kappa\sqrt{\frac{S_{master}}{S_0}}\sin(-\varphi_0)\right]g_N S_0, \quad (9)$$

where $\phi_0$ is the injection-locked phase difference between the injected and intracavity fields, $S_0$ is the photon number in the slave cavity, and $S_{master}$ is the number of photons incident from the master laser. The sine term approaches unity as the positive detuning increases. However, the resonance frequency $\omega_{res}$ goes up, forcing $\omega_p$ to smaller values. Two design parameters can be used to maximize $\omega_p$: 1) higher differential gain $g_N$, and 2) increased optical power in the slave cavity. We note that a larger $\alpha$ parameter, a higher coupling efficiency (increased coupling rate coefficient $\kappa$), and increased power from the master laser $S_{master}$ would all result in an increased $\omega_{res}$ according to Eqs. (3)-(5), hence they would be ineffective in increasing $\omega_p$. The most straightforward method to maximize $\omega_p$ is to increase internal optical power of the slave laser. By increasing the slave laser bias current from $1.3 \times I_{th}$ to $5 \times I_{th}$, a very significant improvement in 3-dB bandwidth from ~1 GHz to a record ~80 GHz (corresponding to $\omega_{res}$=68 GHz) has been demonstrated in injection-locked VCSELs [Lau 2008b].

C. Injection-Locked VCSELs vs Microring Lasers

As described in Section B, injection locking has been actively researched for its potential to improve ultrahigh frequency performance of semiconductor lasers for both digital and analog applications, with VCSELs demonstrating the record high values for enhanced modulation bandwidth. VCSELs were considered to be particularly attractive as injection-locked transmitters because of: 1) short cavity length, leading to a high coupling efficiency, 2) single-mode operation, and 3) low power, resulting in increased injection ratio $P_{master}/P_{slave}$ ($P_{master}$ is the incident optical power and $P_{slave}$ is the VCSEL output power) when a master laser with relatively high power is used. The coupling rate coefficient $\kappa$, as given by [Schunk 1986] for standard Fabry-Perot lasers, is:

$$\kappa = c\sqrt{1-R}/(2n_{g,eff}L), \quad (10)$$

where R is the reflectivity of the laser mirror through which the light is injected and L is the cavity length. Thus, a short cavity length results in a higher coupling efficiency. However, in order to keep the lasing threshold at a reasonably low level, VCSELs require very high mirror reflectivity R, which according to Eq. (10) would bring $\kappa$ down to a very small value. The value of $\kappa \approx 1 \times 10^{12}$ s$^{-1}$, estimated using Eq. (10), was reported for VCSELs used in [Chrostowski 2006b].

While the parameter $P_{master}/P_{slave}$, defined in [Chrostowski 2006b] as the ratio of the optical power incident on the VCSEL and the output power of the free-running VCSEL, is easy to determine experimentally, it is the ratio of injected power and internal power in the active region of the slave laser that determines its behavior. For example, the stable locking range is given by [Henry 1985]

$$-\frac{c}{2n_{g,eff}L}\sqrt{\frac{S_{inj}}{S}}\sqrt{1+\alpha^2} < \Delta\omega_{inj} < \frac{c}{2n_{g,eff}L}\sqrt{\frac{S_{inj}}{S}}, \quad (11)$$

where $S_{inj}$ is the number of photons injected from the master laser and S is the number of photons inside the slave laser cavity. Eq. (11) can also be rewritten in terms of the incident power $P_{master}$ and the coupling rate coefficient $\kappa$ as $$-\kappa\sqrt{\frac{P_{master}}{P}}\sqrt{1+\alpha^2} < \Delta\omega_{inj} < \kappa\sqrt{\frac{P_{master}}{P}}, \quad (11a)$$

where P is the slave laser internal power. Both the wavelength detuning range $\Delta\omega_{inj}$ for stable injection locking (>2 nm) and enhanced resonant frequency $\omega_{res}$ (up to ~107 GHz) have been reported to increase with the injection ratio, with no upper limit observed within the instrumentation limit. This is in good agreement with Eq. (3), where both terms on the right-hand side can be made to increase with increased injection rate.

The steady-state analysis of Eqs. (4)-(6) [Murakami 2003] revealed that two parameters are of key importance for achieving highly enhanced modulation bandwidth (for a given internal power of the slave laser)—the cavity roundtrip time $\tau_{rt}=2n_{g,eff}L/c$ and the reflectivity R of the cavity mirror used for injection. Under steady-state injection-locking conditions, the right-hand side of Eq. (3) can be written as $$\omega_{res} = -\kappa\frac{E_{inj}}{E_0}\sin\varphi_0 = -\frac{c\sqrt{1-R}}{2n_{g,eff}L}\frac{E_{inj}}{E_0}\sin\varphi_0, \quad (12)$$

with the phase difference $\phi_0$ between the injected and intracavity fields given by $$\varphi_0 = \sin^{-1}\left\{-\frac{\Delta\omega_{inj}}{\kappa\sqrt{1+\alpha^2}}\frac{E_0}{E_{inj}}\right\} - \tan^{-1}\alpha. \quad (13)$$

As the frequency detuning moves to the positive edge of the locking range in Eq. (11), $\omega_0$ approaches $-\pi/2$, thereby increasing $\omega_{res}$ [Mogensen 1985], [Murakami 2003]. The smallest possible values for both $\tau_{rt}$ and R (maximizing the coupling rate coefficient $\kappa$) would be ideal for reaching the ultimate limits of modulation bandwidth enhancement in injection-locked lasers. The inherent design trade-off between these parameters, however, makes further optimization of both edge-emitting lasers and VCSELs for enhanced high-speed performance very problematic. While injection-locked VCSELs benefit greatly from very short cavities and, hence, very small $\tau_{rt}$, their high-speed performance, at the same time, is compromised by very high mirror reflectivity of a typical VCSEL, resulting in coupling rate coefficients similar to edge emitters. Further improvement of modulation bandwidth in injection-locked VCSELs is expected to come solely from higher power master lasers used for optical injection [Lau 2008b]. For this reason, more complicated cascaded schemes have been attempted, with demonstrated improvement in modulation bandwidth as compared to solitary injection-locked VCSELs [Zhao 2007]. The cascaded optical injection locking is a very promising technique that has scaling-up potential to eventually reach very wide modulation bandwidth over 100 GHz by cascading more slave lasers in a daisy chain structure, as long as the master laser has enough power to stably lock the slave laser with the largest detuning value [Zhao 2007]. This, however, can hardly be realized with VCSELs, notable for their very high mirror reflectivity. In addition, stand-alone VCSELs pose a very serious alignment problem in injection-locking experiments and, at the same time, are not suitable for monolithic integration when injection locking is the requirement. We believe VCSELs are very hard to be optimized for any further improvement in their speed.

SUMMARY OF THE INVENTION

The present invention provides a semiconductor light-emitting device comprising a semiconductor ring laser (SRL) section monolithically integrated on a substrate with a distributed feedback (DFB) master laser section or distributed Bragg reflector (DBR) master laser section such that the ring laser section can be operated in an injection locking mode while being subjected to direct injection current modulation. The monolithic device may be microchip-size that yields a low-cost ultrafast (over 100 GHz bandwidth) functional optical light transmitter that will be easy to use in practice.

In an illustrative embodiment of the present invention, the device incorporates a SRL, DBR or DFB laser, waveguides, directional couplers, detector and nonreciprocating waveguide elements monolithically integrated on a semiconducting substrate. All the functional elements or sections of the device have single-transverse-mode ridge waveguide structure that may be identical for some or all of them, and share one or more layers of the semiconductor wafer structure spanning the entire length of the chip. The monolithically integrated ring laser section and DBR or DFB master laser section have identical or nearly identical single-transverse-mode ridge-waveguide laser structure and share a system of layers comprising the active region of both. A waveguide section with the same waveguide structure and system of layers is provided between and shared by the master laser section and the ring laser section, and used to transmit the output from the master DBR or DFB laser and inject it into the SRL. Non-reciprocating curved waveguide sections are provided branching off from that "injecting" waveguide to suppress any optical feedback from the SRL to the master DBR or DFB laser. The ring laser section may include an S-shaped waveguide section to promote a unidirectional operation of the ring laser. A waveguide directional coupler section is provided proximate the ring laser section to collect its output. An integrated photodetector located at the backside of the master DBR or DFB laser is provided to monitor the emission from the master laser. The device includes independent electrical contacts to apply direct injection current to the master laser section and the S-shaped waveguide section, to apply direct injection current and high-speed modulated current signal to the ring laser section, and to apply a reverse bias voltage to the photodetector in a manner to provide injection locking of the directly modulated ring laser. Optional electrical contacts can be supplied for the passive waveguide sections to reduce optical loss and provide controllable amplification of the circulating optical signal.

The present invention also envisions a method of injection locking a directly modulated semiconductor ring laser to achieve enhanced modulation bandwidth by integrating a semiconductor ring laser section with a semiconductor master laser section on a semiconducting substrate so that the former receives light emitted from the master laser section and by selective tuning different input currents in a manner to establish an injection locking mode of operation of the ring laser section and to adjust the resonant frequency offset between the master laser section and the semiconductor ring laser section such as to improve modulation bandwidth of the ring laser.

The invention envisions both a single-SRL system as well as cascaded systems having multiple SRL sections and also both digital and analog modulation in practice of the invention. For example, practice of the invention can be easily extended to a monolithically integrated cascaded scheme, in which the light output from one ring laser section is carried by the directional waveguide coupler to another ring laser section. Multiple stages of cascading can be implemented by taking this approach.

Practice of the present invention can be advantageous to provide high performance, small size, low cost, ultra-high-speed integrated light-emitting devices for all levels of telecommunication networks. Development of inexpensive ultrafast chips operating at speeds close to or exceeding 100 GHz bandwidth will have a huge societal impact by increasing the transmission capacity of fiber-based networks.

These and other advantages of the present invention will become more readily apparent from the following detailed description taken with the following drawings.

BRIEF DESCRIPTION OF THE DRAWINGS

FIG. 1$a$ shows the spectrum without injection where $\omega_0$ is angular frequency of the solitary laser, $\omega_{inj}$ is frequency of the master laser, and $\Delta\omega_{inj}$ is the frequency detuning. FIG. 1$b$ shows the cavity resonance condition under injection locking where $\omega_{shift}$ is the cavity resonance frequency shifted towards lower frequency from $\omega_0$ by $\Delta\omega(N)$ due to light injection.

DETAILED DESCRIPTION OF THE INVENTION

Figure 1A:
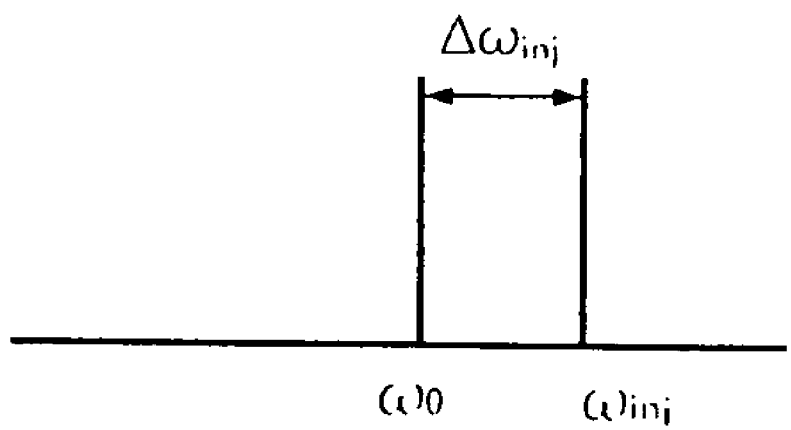
FIGS. 1$a$ and 1$b$ are schematic illustrations of the effects of optical injection on resonant condition in a semiconductor laser.
Figure 1B:
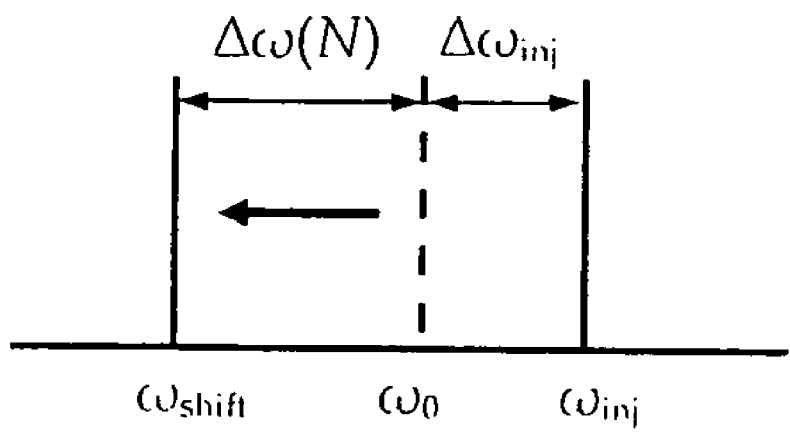
Figure 2:
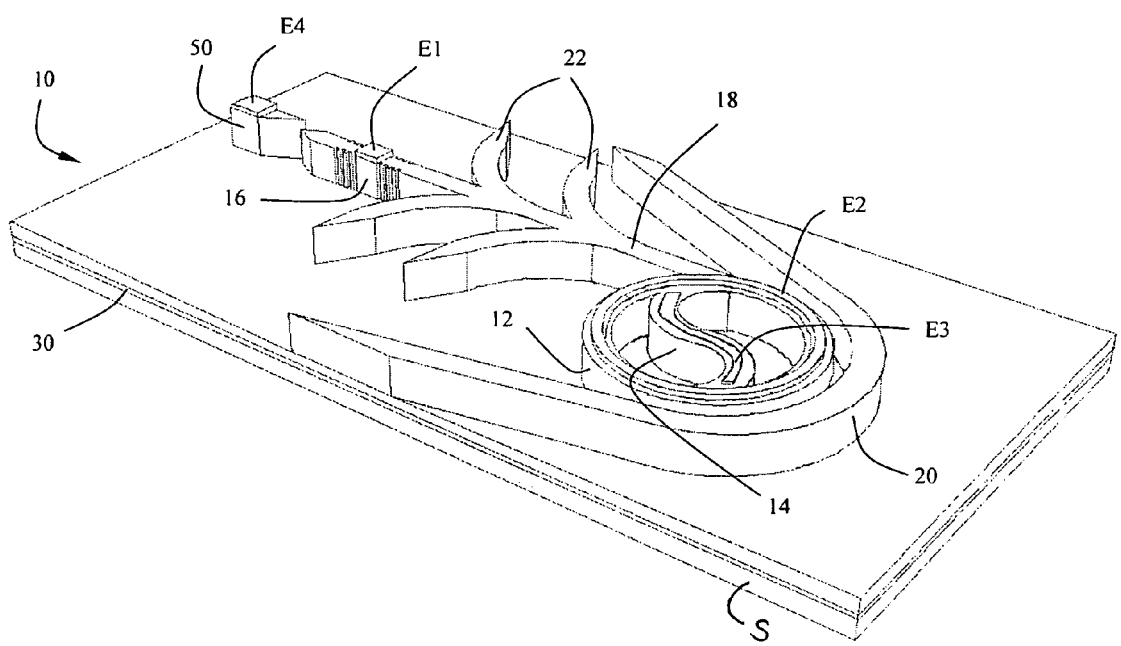
FIG. 2 is a perspective view of a ridge-waveguide type structure of a semiconductor light-emitting device pursuant to an embodiment of the invention having a unidirectional semiconductor ring laser section that is monolithically integrated with distributed Bragg reflector (DBR) semiconductor laser section on a common substrate. For clarity, the ridge-waveguide structure of the device is shown as it is formed as a result of an intermediate processing step that involves etching of the semiconductor wafer through a mask defining the ridge-waveguide structure. The ridge-waveguide structure is then planarized with isolating dielectric material (for example, polyimide or BCB), and the electrical contacts schematically shown in the Figure are connected to contact pads provided on top of the dielectric material.

As shown in FIG. 2, an embodiment of the present invention provides a semiconductor light-emitting device 10 having a unidirectional semiconductor ring laser (USRL) section 12 monolithically integrated with a high-power semiconductor distributed Bragg reflector (DBR) (alternatively, distributed feedback, DFB) laser section 16 in a manner that can provide an injection locking mode of operation of the USRL section (slave laser) by injecting light from the DBR (DFB) laser section (master laser) wherein the slave laser section is substantially locked to the same frequency as the master laser section and wherein a significant increase in modulation bandwidth is thereby provided. The above integration thus can result in a low-cost, ultrafast (over 100 GHz) functional optical light-emitting transmitter.

Use of a unidirectional semiconductor ring laser (USRL) section as a slave laser in practice of the invention is advantageous to provide minimal back reflections (eliminating the need for optical isolators protecting the master laser section from optical feedback), while simultaneously allowing for complete coupling of the master DBR (DFB) laser output into the ring laser section, supporting the favored propagation direction. By the very nature of USRL, low reflectivity for incident light does not at all compromise quality of the ring cavity and does not affect the threshold condition for the wave propagating in the favored direction. The USRL thus is free from the design constraints that edge-emitting lasers and VCSELs suffer from. In contrast to VCSELs, use of the USRL geometry allows for easy cascading of individual ring lasers integrated on the same chip.

The terminology used herein relating to the unidirectional semiconductor ring laser (USRL) section being monolithically integrated with a semiconductor distributed Bragg reflector (DBR) laser section or a semiconductor distributed feedback (DFB) laser section refers to a single or unitary structure formed on a semiconducting substrate with the structures being formed by various differently doped and undoped layers and regions on the substrate, although the structures may have different functionalities.

Figure 3:
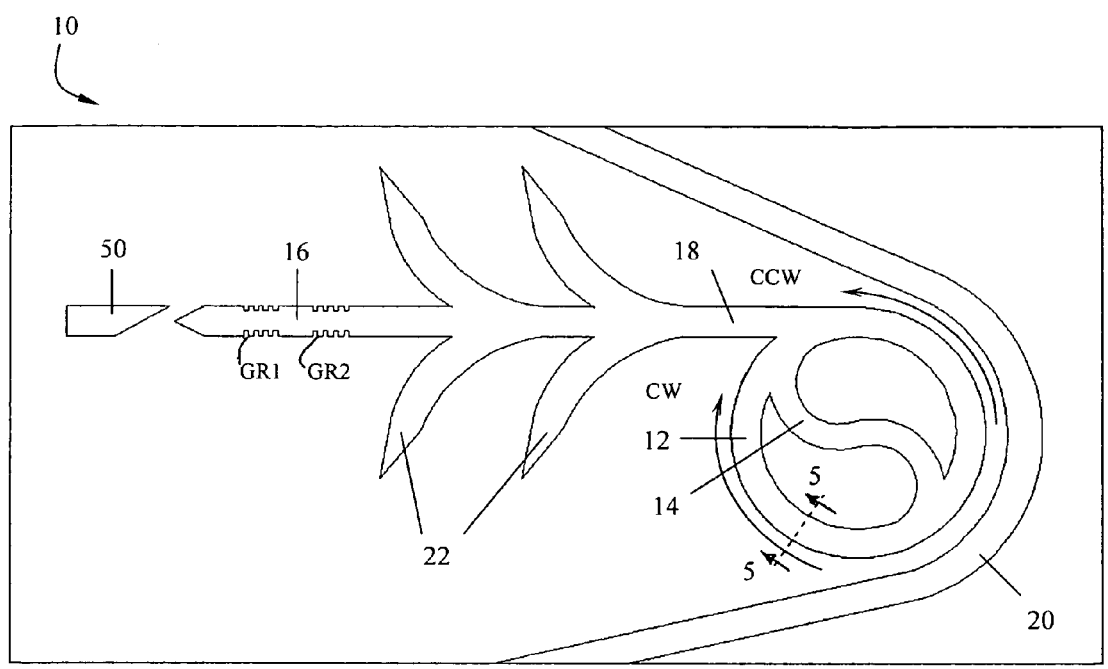
FIG. 3 is a top plan view of a semiconductor light-emitting device pursuant to an embodiment of the invention showing a single unidirectional SRL system.

Referring to FIGS. 2-3, apart from the USRL and DBR (DFB) laser sections, the light-emitting device 10 also incorporates passive waveguides, directional couplers, detector and nonreciprocating waveguide elements monolithically integrated on the same semiconducting substrate S. All functional elements or sections of the device have single-transverse-mode ridge waveguide structure that may be identical for some or all of them, and share one or more layers of the semiconductor wafer structure spanning the entire length of the chip. The monolithically integrated unidirectional ring laser section 12 and DBR (DFB) master laser section 16 have identical or nearly identical single-transverse-mode ridge-waveguide laser structure and share a system of layers comprising the active region of both (shown in FIG. 2 as layer 30 spanning the entire length of the device. The layer structure is electrically stimulated to achieve amplification and emission of light within the active region. A waveguide section 18 with the same waveguide structure and system of layers is provided between and shared by the master laser section and the ring laser section, and used to transmit the output from the master DBR (DFB) laser and inject it into the USRL. The identical transverse waveguide structure and system of layers shared by these three (16, 18, and 12) sections of the device automatically align the laser sections and ensure common laser polarization in them.

Unidirectional operation of the ring laser section 12 is promoted by the S-shaped active waveguide section 14 integrated therewith, FIGS. 2-3. The S-shaped section 14 of the waveguide favors a particular (clockwise CW in this case versus counterclockwise CCW) propagation direction of the light by converting one of the counter-propagating waves into the preferred one. In addition, the injected light signal from the master DBR laser will strongly favor the preferred propagation direction.

The ring laser section 12 can be 100 μm in diameter or smaller to provide sufficiently high intermodal gain discrimination to support single longitudinal mode operation of the ring laser under direct injection current modulation. Single-longitudinal mode of operation is important to observe the modulation bandwidth enhancement provided by optical injection locking. In addition to that, having as small ring cavity as possible is advantageous as it improves the high-frequency performance of the free-running USRL, which performance is further improved by optical injection locking, resulting in the overall superior performance of the device. Other shapes of the USRL, such as racetrack shape, are equally applicable to the present invention.

A passive waveguide directional coupler section 20, FIGS. 2-3, is used to collect the output of the ring laser section 12. The directional waveguide coupler 20 is positioned such that only a small fraction of internally circulating light is coupled out of the USRL. The same directional coupler is also used to collect the output of the DBR laser section 16 when the ring laser section is not operating. The output facets of the waveguide section 20 are at Brewster's angle to minimize optical reflections.

Several curved waveguide sections 22 that branch off from the "injecting" waveguide section 18 in FIGS. 2-3 serve to suppress any optical feedback from the USRL slave section 12 to the DBR master laser section 16. FIGS. 2-3 show that the curved waveguide sections are gradually tapered in width to reduce the lateral confinement and increase the bending loss. Other embodiments with straight tapered waveguides or nontapered lossy waveguides are also possible. The tapering and curvature dimensions may be chosen such that sufficient bending and narrowing of the curved waveguide results in conversion of guided modes into leaky or radiation modes.

Figure 4:
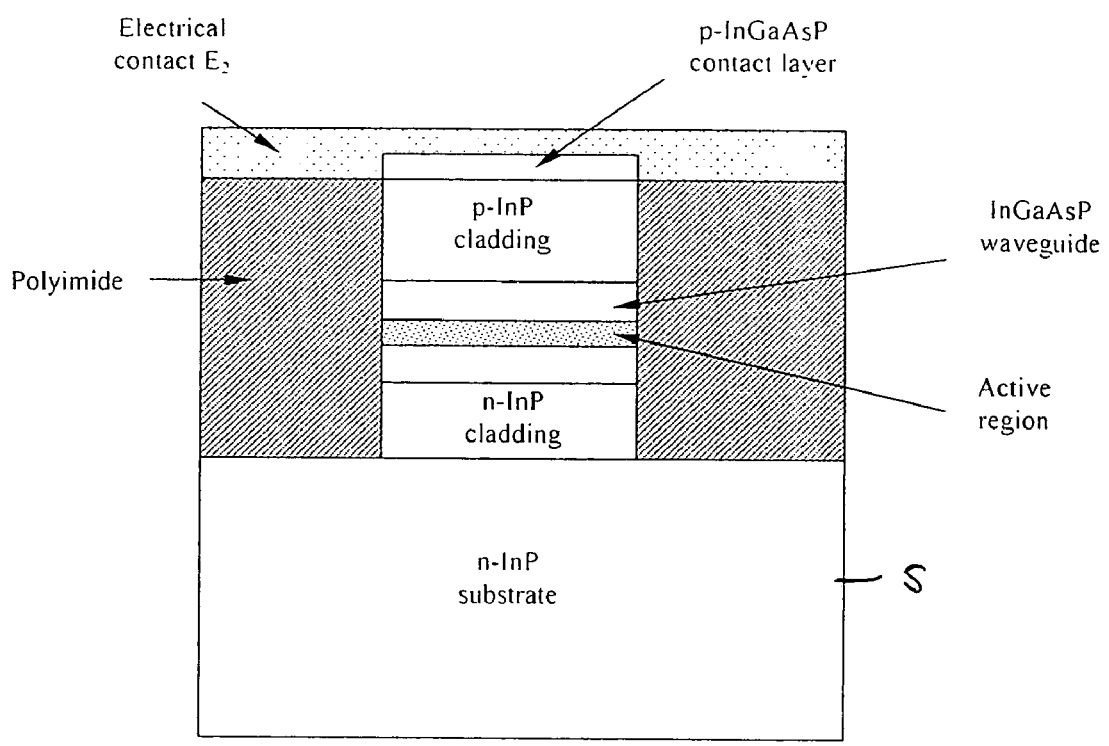
FIG. 4 is a cross-sectional view of the ridge waveguide structure shown on FIG. 3 where the section is of the SRL structure taken using "5-5".

FIG. 4 illustrates an exemplary cross-sectional layer arrangement of the USRL structure or section 12 of an embodiment of the device shown in FIGS. 2-3. The general shape of the cross-section indicates the ridge waveguide nature of the device. In one embodiment, the epitaxial layer structure can be grown on n-type InP substrate S. The active region 30 is placed in the center of the 500-nm-thick InGaAsP waveguide layer with bandgap at 1.25 μm. The waveguide layer is clad below by 500-nm n-InP, and above by 1500-nm p-InP, finalized by a 100-nm-thick p-InGaAsP contact layer.

Suitable materials for forming the active region include, but are not limited to InAs, InGaAs, and InGaAsP. The active region can include a stack of multiple quantum well (MQW) layers, a stack of quantum dot layers, or a single bulk active layer.

All functional sections of the device, namely the unidirectional semiconductor ring laser (USRL) section 12; DBR or DFB laser section 16; S-shaped waveguide section 14; passive waveguide section 18, curved waveguide sections 22; directional waveguide coupler 20; and photodetector 50 have the same basic ridge waveguide structure shown in FIG. 4, which is offered for purposes of illustration since modifications can be made to the structure. For example, one or more layers adjacent to the active region can be modified to realize the proper distributed feedback effect in either DBR or DFB laser section 16 of the device.

The dimensions and shape of the ridge-waveguide structure, used as a basis for all the functional sections of the device, are chosen in such a way as to ensure single-transverse-mode operation of the device. In particular, the well known tradeoff between the ride width and ridge height (equivalently, etching depth defining the ridge height) determines the combination of these two ridge-waveguide parameters providing single-transverse-mode operation of the device. Typically, the patterned semiconductor wafer is etched to a depth near or through the active layer. For devices with larger radii of curvature of the ring laser cavity and hence lower bend losses the etch depth can be reduced to penetrate only the region of the upper cladding layer. For devices with very small microring laser cavity and higher bend losses the etch depth can be increased to partially or completely penetrate the lower cladding layer. The relatively narrower width of the ridge waveguide is required in the latter case to support single-transverse-mode operation. In one embodiment of the invention, we provide a 10-μm diameter 1.55-μm InP/InGaAsP ring laser with 0.8-μm-wide ridge waveguide formed by etching the InP/InGaAsP semiconductor wafer to a depth of approximately 2.5 μm, well into the bottom n-InP cladding layer.

The basic DBR structure can comprise surface lateral gratings, schematically shown as GR1 and GR2 in FIG. 3, as used in laterally coupled DFB lasers [Pozzi 2006]. Use of surface lateral gratings for the DBR laser section 16 requires no regrowth over patterned substrates and allows definition of the DBR laser section 16, the USRL section 12, the photo detector 50, and all the waveguide sections and coupler sections described above in a single reactive ion etching (RIE) step described below to fabricate the optoelectronic integrated circuit (OEIC), thus reducing the technological complexity. To maximize the light output directed towards the USRL section 12, the back mirror (represented by grating GR1) of the DBR master section 16 can have a much higher reflectivity (e.g. 99%) than that (e.g. 80%) of the front mirror (represented by grating GR2) thereof.

Although a DBR master laser section is described above, the invention is not so limited and can be practiced using a DFB master laser section with appropriate grating.

An integrated photodetector 50, FIGS. 2-3, can be optionally located at the backside of the DBR laser section 16 and can be used to monitor the emission from the master laser. The input facet of the photodiode 50 is at Brewster's angle to minimize optical reflections.

The device includes independent electrical contacts E1, E2, E3, and E4 to apply direct injection current to the master laser section (using E1) and the S-shaped waveguide section (using E3), to apply direct injection current and high-speed (high frequency) modulation signal to the ring laser section (using E2), and to apply a reverse bias voltage to the photodetector (using E4) in a manner to provide injection locking of the directly modulated ring laser. Conventional laser diode drivers can be used as sources of direct current for the laser sections and S-shaped waveguide section of the device to this end. Conventional ultra high-frequency signal generator can be used to provide modulated current signal for the ring laser section. A conventional constant voltage source can be used for the photodetector to this end. Optional electrical contacts can be supplied for the passive waveguide sections to reduce optical loss and provide controllable amplification of the circulating optical signal. Although not shown, one or more additional electrical contacts are disposed on the back side of the semiconducting substrate S below the ridge-waveguide structure of the device. The top and bottom contacts are in electrical communication and used for control of the device during its operation. The operating wavelengths of the laser sections and their output power (and so the level of optical injection from the master laser section into the USRL) are controlled through the injection currents applied to the corresponding sections. Injection locking mode of operation of the ring laser section is therefore established by selective tuning different input currents.

The laser sections 12, 16 as well as other monolithically integrated waveguide sections are formed using various semiconductor materials that are arranged in layers, regions, and sections and that are appropriately doped or undoped for a selected functionality thereof. Fabrication of the semiconductor laser devices pursuant to the invention can be conducted using conventional semiconductor laser production operations wherein multiple semiconductor lasers pursuant to the invention are fabricated on a larger semiconductor wafer which is then separated into a plurality of semiconductor laser devices.

The preferred material system for the fabrication of the semiconductor light-emitting device 10 of the present invention is InP/InGaAsP. The preferred method for growing the epitaxial semiconductor wafer for fabrication of the device 10 in the present invention is metal-organic vapor-phase epitaxy (MOVPE). Other epitaxial growth techniques including metal-organic chemical vapor deposition (MOCVD), and molecular beam epitaxy (MBE), as well as other semiconductor material systems and other epitaxial layer structures are applicable to the present invention.

After the growth of the epitaxial semiconductor wafer, the portions of the wafer undergo further processing that results in creation of the ridge waveguide structures forming all the functional sections of the device. In an exemplary process, electron beam lithography and liftoff are used to form a 60-nm-thick Ti ridge waveguide mask on top of a 50-nm SiN layer deposited on the wafer. The SiN is dry etched with reactive ion etching (RIE) to form the final mask consisting of the Ti and SiN layers. $H_2$—$CH_4$ is used to etch the InP-InGaAsP layers and the active region to a depth of approximately 2.5 μm, well into the bottom n-InP cladding. Polyimide is then used to planarize the ridge waveguide structure. The top p-type electrical contacts are made with optical lithography, evaporation of Ti-Pt-Au, and liftoff. Although not shown in the figures, the n-type electrical contact is made on the back side of the wafer (substrate) also with Ti-Pt-Au.

A method embodiment of the invention provides a method of injection locking a directly modulated unidirectional semiconductor ring laser to achieve enhanced modulation bandwidth. The method embodiment includes the steps of providing a semiconductor light-emitting device comprising a unidirectional semiconductor ring laser section USRL monolithically integrated with a semiconductor master laser section DBR (DFB) on the common substrate S; supplying a direct current bias to the master laser section such that the master laser output has a power level sufficient to significantly increase the density of photons inside the unidirectional semiconductor ring laser section; supplying a direct current bias and a high-speed modulated electrical input signal to the unidirectional semiconductor ring laser section for emitting light modulated in response to the input signal; selective tuning different input currents to establish an injection locking mode of operation of the ring laser section and to adjust the resonant frequency offset between the master laser section and the unidirectional semiconductor ring laser section such as to improve modulation bandwidth of the ring laser.

Figure 5:
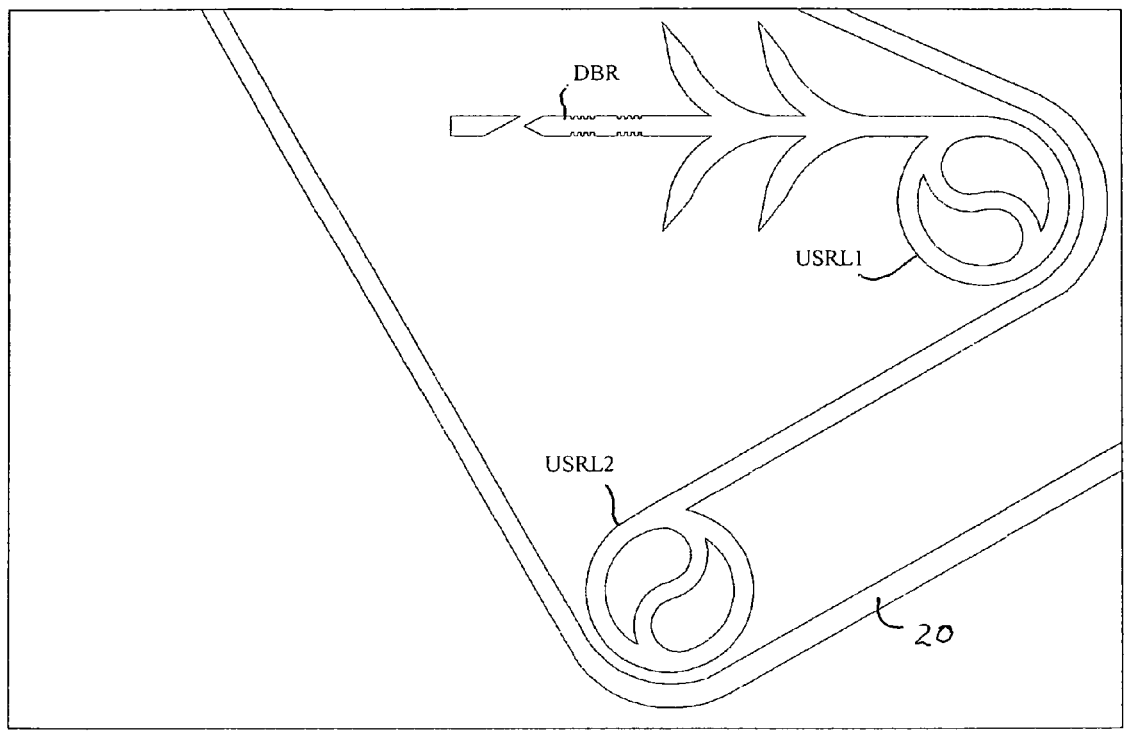
FIG. 5 is a top plan view of a semiconductor light-emitting device pursuant to an embodiment of the invention showing a cascaded system of two optically connected unidirectional SRL sections.

The optoelectronic integrated circuit (OEIC) illustrated in FIGS. 2-3 and method embodiments can be easily extended to a monolithically integrated cascaded scheme, in which the output from the ring laser section 12 is carried by passive waveguide directional coupler section 20 to another similar unidirectional microring laser. Unidirectional semiconductor ring lasers USRL1 and USRL2 shown in FIG. 5 can be independently supplied with direct injection current and modulated at ultra high speed through direct injection current modulation. Multiple stages of cascading can be implemented by taking this approach.

Although certain embodiments of the invention have been described in detail herein, those skilled in the art will appreciate that modifications and changes can be made therein with the scope of the invention as set forth in the appended claims.

REFERENCES CITED

[Chang 2002] W. S. C. Chang, Ed., *RF Photonic Technology in Optical Fiber Links*, Cambridge Univ. Press, Cambridge, UK 2002, Chs. 4-7.

[Chang 2003] C. H. Chang, L. Chrostowski, and C. J. Chang-Hasnain, "*Injection locking of VCSELs*", IEEE J. Sel. Top. Quantum Electron. 9 (#5), pp. 1386-1393, September-October 2003.

[Chen 2000] H. F. Chen, J. M. Liu, and T. B. Simpson, "*Response characteristics of direct current modulation on a bandwidth-enhanced semiconductor laser under strong injection locking*", Opt. Commun. 173 (#1-6), pp. 349-355, 1 Jan. 2000.

[Chrostowski 2002] L. Chrostowski, C. H. Chang, and C. J. Chang-Hasnain, "*Injection-locked 1.55 μm VCSELs with enhanced spur-free dynamic range*", Electron. Lett. 38 (#17), pp. 965-967, 15 Aug. 2002.

[Chrostowski 2003] L. Chrostowski, C. H. Chang, and C. J. Chang-Hasnain, "*Enhancement of dynamic range in 1.55-μm VCSELs using injection locking*", IEEE Photon. Technol. Lett. 15 (#4), pp. 498-500, April 2003.

[Chrostowski 2006a] L. Chrostowski, X. Zhao, C. J. Chang-Hasnain, R. Shau, A. Ortsiefer, and M. C. Amann, "*50-GHz optically injection-locked 1.55-μm VCSELs*", IEEE Photon. Technol. Lett. 18 (#1-4), pp. 367-369, January-February 2006.

[Chrostowski 2006b] L. Chrostowski, X. X. Zhao, and C. J. Chang-Hasnain, "*Microwave performance of optically injection-locked VCSELs*", IEEE Trans. Microw. Theory Tech. 54 (#2, Pt. 2), pp. 788-796, February 2006.

[Chung 1991] H. Y. Chung, W. S. C. Chang, and E. L. Adler, "*Modeling and optimization of traveling-wave LiNbO$_3$ interferometric modulators*", IEEE J. Quantum Electron. 27 (#3), pp. 608-617, March 1991.

[Covega 2008] Covega Corporation, Jessup, Md.: http://www.covega.com/Products/?catID=7

[Cox 2006] C. H. Cox III, E. I. Ackerman, G. E. Betts, and J. L. Prince, "*Limits on the performance of RF-over-fiber links and their impact on device design*", IEEE Trans. Microw. Theory Tech. 54 (#2, Pt. 2), pp. 906-920, February 2006.

[Gopalakrishan 1994] G. K. Gopalakrishnan and W. K. Burns, "*Performance and modeling of resonantly enhanced LiNbO$_3$ modulators for low-loss analog fiberoptic links*", IEEE Trans. Microw. Theory Tech. 42 (#12, Pt. 2), pp. 2650-2656, December 1994.

[Henry 1985] C. H. Henry, N. A. Olsson, and N. K. Dutta, "*Locking range and stability of injection locked 1.54-μm InGaAsP semiconductor lasers*", IEEE J. Quantum Electron. 21 (#8), pp. 1152-1156, 1985.

[Hwang 2004] S. K. Hwang, J. M. Liu, and J. K. White, "*35-GHz intrinsic bandwidth for direct modulation in 1.3-μm semiconductor lasers subject to strong injection locking*", IEEE Photon. Technol. Lett. 16 (#4), pp. 972-974, April 2004.

[Jin 2006] X. M. Jin and S. L. Chuang, "*Bandwidth enhancement of Fabry-Perot quantum-well lasers by injection-locking*", Solid-State Electron. 50 (#6), pp. 1141-1149, June 2006.

[Jones 2000] R. J. Jones, P. S. Spencer, and K. A. Shore, "*Influence of detuned injection locking on the relaxation oscillation frequency of a multimode semiconductor laser*", J. Mod. Opt. 47 (#11), pp. 1977-1986, September 2000.

[Kjebon 1997] O. Kjebon, R. Schatz, S. Lourdudoss, S. Nilsson, B. Stalnacke, and L. Backbom, "*30 GHz direct modulation bandwidth in detuned loaded InGaAsP DBR lasers at 1.55 μm wavelength*", Electron. Lett. 33 (#6), pp. 488-489, March 1997.

[Kobayashi 1976] K. Kobayashi and R. Lang, "*Suppression of the relaxation oscillation in the modulated output of semiconductor lasers*", IEEE J. Quantum Electron. 12 (#3), pp. 194-199, March 1976.

[Lang 1982] R. Lang, "*Injection locking properties of a semiconductor laser*", IEEE J. Quantum Electron. 18 (#6), pp. 976-983, 1982.

[Lau 1984] K. Y. Lau and A. Yariv, "*Intermodulation distortion in a directly modulated semiconductor injection laser*", Appl. Phys. Lett. 45 (#10), pp. 1034-1036, 1984.

[Lau 1985] K. Y. Lau and A. Yariv, "*Ultra-high speed semiconductor lasers*", IEEE J. Quantum Electron. 21 (#2), pp. 121-138, 1985.

[Lau 2007] E. K. Lau, H.-K. Sung, and M. C. Wu, "*Scaling of resonance frequency for strong injection-locked lasers*", Optics Lett. 32 (#23), pp. 3373-3375, December 2007.

[Lau 2008a] E. K. Lau, H.-K. Sung, and M. C. Wu, "*Frequency response enhancement of optical injection-locked lasers*", IEEE J. Quantum Electron. 44 (#1), pp. 90-99, January 2008.

[Lau 2008b] E. K. Lau, X. X. Zhao, H.-K. Sung, D. Parekh, C. Chang-Hasnain, and M. C. Wu, "*Strong optical injection-locked semiconductor lasers demonstrating >100-GHz resonance frequencies and 80-GHz intrinsic bandwidths*", Opt. Express 16 (#9), pp. 6609-6618, April 2008.

[Lear 1997] K. L. Lear, M. Ochiai, V. M. Hietala, H. Q. Hou, B. E. Hammons, J. J. Banas, and J. A. Nevers, "*High-speed vertical cavity surface emitting lasers*", in Proc. IEEE/LEOS Summer Topical Meetings, pp. 53-54, 1997.

[Lee 2002] M. Lee, H. E. Katz, C. Erben, D. M. Gill, P. Gopalan, J. D. Heber, and D. J. McGee, "*Broadband modulation of light by using an electro-optic polymer*", Science 298 (#5597), pp. 1401-1403, 15 Nov. 2002.

[Li 1996] H. Li, T. L. Lucas, J. G. McInerney, M. W. Wright, and R. A. Morgan, "*Injection locking dynamics of vertical cavity semiconductor lasers under conventional and phase conjugate injection*", IEEE J. Quantum Electron. 32 (#2), pp. 227-235, February 1996.

[Liu 1997] J. M. Liu, H. F. Chen, X. J. Meng, and T. B. Simpson, "*Modulation bandwidth, noise, and stability of a semiconductor laser subject to strong injection locking*", IEEE Photon. Technol. Lett. 9 (#10), pp. 1325-1327, October 1997.

[Luo 1990] J.-M. Luo and M. Osinski, "*Side-mode injection locking characteristics of semiconductor lasers: Multimode analysis*", Proc. 1$^{st}$ International Workshop on Photonic Networks, Components and Applications (J. Chrostowski and J. Terry, Eds.), Montebello, Quebec, Canada, 11-13 Oct., 1990, Series in Optics and Photonics Vol. 2, World Scientific, Singapore 1991, pp. 195-199.

[Luo 1991] J.-M. Luo and M. Osiński, "*Stable-locking bandwidth in sidemode injection locked semiconductor lasers*", Electron. Lett. 27 (#19), pp. 1737-1739, 12 Sep. 1991.

[Luo 1992a] J.-M. Luo and M. Osiński, "*Side-mode injection locking characteristics of semiconductor lasers. Frequency and field noise spectra*", Proc. 2$^{nd}$ IEEE International Workshop on Photonic Networks, Components and Applications (J. Chrostowski and J. Terry, Eds.), Montebello, Quebec, Canada, 9-11 Mar. 1992, OCRI Publications, pp. 3.1.1-3.1.6.

[Luo 1992b] J.-M. Luo and M. Osiński, "*Multimode small-signal analysis of side-mode injection-locked semiconductor lasers*", Jpn. J. Appl. Phys. Pt. 2 (Lett.) 31, pp. L685-L688, June 1992.

[Matsui 1997] Y. Matsui, H. Murai, S. Arahira, S. Kutsuzawa, and Y. Ogawa, "30-*GHz bandwidth* 1.55-μm *strain-compensated InGaAlAs-InGaAsP MQW laser*", IEEE Photonics Technol. Lett. 9 (#1), pp. 25-27, January 1997.

[Meng 1998] X. J. Meng, T. Chau, and M. C. Wu, "*Experimental demonstration of modulation bandwidth enhancement in distributed feedback lasers with external light injection*", Electron. Lett. 34 (#21), pp. 2031-2032, 15 Oct. 1998.

[Meng 1999] X. J. Meng, T. Chau, and M. C. Wu, "*Improved intrinsic dynamic distortions in directly modulated semiconductor lasers by optical injection locking*", IEEE Trans. Microw. Theory Tech. 47 (#7, Pt. 2), pp. 1172-1176, July 1999.

[Mogensen 1985] F. Mogensen, H. Olesen, and G. Jacobsen, "*Locking conditions and stability properties for a semiconductor laser with external light injection*", IEEE J. Quantum Electron. 21 (#7), pp. 784-793, 1985.

[Mohrdiek 1994] S. Mohrdiek, H. Burkhard, and H. Walter, "*Chirp reduction of directly modulated semiconductor lasers at 10 Gb/s by strong CW light injection*", J. Lightwave Technol. 12 (#3), pp. 418-424, March 1994.

[Murakami 2003] A. Murakami, K. Kawashima, and K. Atsuki, "*Cavity resonance shift and bandwidth enhancement in semiconductor lasers with strong light injection*", IEEE J. Quantum Electron. 39 (#10), pp. 1196-1204, October 2003.

[Nizette 2002] M. Nizette, T. Erneux, A. Gavrielides, and V. Kovanis, "*Averaged equations for injection locked semiconductor lasers*", Physica D 161 (#3-4), pp. 220-236, January 2002.

[Nizette 2003] M. Nizette, T. Erneux, A. Gavrielides, and V. Kovanis, "*Stability and bifurcations of periodically modulated, optically injected laser diodes*", Phys. Rev. E 63 (#2, Pt. 2), Art. 026212, February 2001.

[Noguchi 1998] K. Noguchi, O. Mitomi, and H. Miyazawa, "*Millimeter-wave Ti:LiNbO$_3$ optical modulators*", J. Lightwave Technol. 16 (#4), pp. 615-619, April 1998.

[Okajima 2003] Y. Okajima, S. K. Hwang, and J. M. Liu, "*Experimental observation of chirp reduction in bandwidth-enhanced semiconductor lasers subject to strong optical injection*", Opt. Commun. 219 (#1-6), pp. 357-364, 15 Apr. 2003.

[Pozzi 2006] F. Pozzi, R. M. De La Rue, and M. Sorel, "*Dual-wavelength InAlGaAs-InP laterally coupled distributed feedback laser*", IEEE Photonics Technol. Lett. 18 (#21-24), pp. 2563-2565, November-December 2006.

[Schunk 1986] N. Schunk and K. Petermann, "*Noise analysis of injection-locked semiconductor injection lasers*", IEEE J. Quantum Electron. 22 (#5), pp. 642-650, May 1986.

[Simpson 1995] T. B. Simpson and J. M. Liu, "*Bandwidth enhancement and broad-band noise-reduction in injection-locked semiconductor lasers*", IEEE Photon. Technol. Lett. 7 (#7), pp. 709-711, July 1995.

[Simpson 1996] T. B. Simpson, J. M. Liu, and A. Gavrielides, "*Small-signal analysis of modulation characteristics in a semiconductor laser subject to strong optical injection*", IEEE J. Quantum Electron. 32 (#8), pp. 1456-1468, August 1996.

[Simpson 1997] T. B. Simpson and J. M. Liu, "*Enhanced modulation bandwidth in injection-locked semiconductor lasers*", IEEE Photonics Technol. Lett. 9 (#10), pp. 1322-1324, October 1997.

[Spencer 1972] M. B. Spencer and W. E. Lamb, Jr., "*Laser with a transmitting window*", Phys. Rev. A 5, pp. 884-892, 1972.

[Sung 2004] H.-K. Sung, T. Jung, M. C. Wu, D. Tishinin, T. Tanbun-Ek, K. Y. Liou, and W. T. Tsang, "*Modulation bandwidth enhancement and nonlinear distortion suppression in directly modulated monolithic injection-locked DFB lasers*", in MWP 2003 Proc. International Topical Meeting on Microwave Photonics, pp. 27-30, 2004.

[Wieczorek 2006] S. Wieczorek, W. W. Chow, L. Chrostowski, and C. J. Chang-Hasnain, "*Improved semiconductor-laser dynamics from induced population pulsation*", IEEE J. Quantum Electron. 42 (#5-6), pp. 552-562, May-June 2006.

[Wong 2006] E. Wong, X. X. Zhao, C. J. Chang-Hasnain, W. Hofmann, and M. C. Amann, "*Optically injection-locked 1.55-μm VCSELs as upstream transmitters in WDM-PONs*", IEEE Photon. Technol. Lett. 18 (#21-24), pp. 2371-2373, November-December 2006.

[Zhao 2004] X. Zhao, M. Moewe, L. Chrostowski, C. H. Chang, R. Shau, M. Ortsiefer, M. C. Amann, and C. Chang-Hasnain, "*28 GHz optical injection-locked 1.55 μm VCSELs*", Electron. Lett. 40 (#8), pp. 476-478, 15 Apr. 2004.

[Zhao 2006] X. X. Zhao, D. Parekh, E. K. Lau, H.-K. Sung, M. C. Wu, and C. J. Chang-Hasnain, "*High extinction ratio of injection-locked 1.55-μm VCSELs*", IEEE Photon. Technol. Lett. 18 (#1-4), pp. 166-168, January-February 2006.

[Zhao 2007] X. X. Zhao, D. Parekh, E. K. Lau, H.-K. Sung, M. C. Wu, W. Hofmann, M. C. Amann, and C. J. Chang-Hasnain, "*Novel cascaded injection-locked 1.55-μm VCSELs with 66 GHz modulation bandwidth*", Opt. Express 15 (#22), pp. 14810-14816, 29 Oct. 2007.

We claim:

1. A semiconductor light-emitting device comprising a semiconductor ring laser monolithically integrated on a common substrate with a single-frequency semiconductor master laser having a frequency-selective element, wherein the light output from the semiconductor master laser is used to injection-lock the semiconductor ring laser to the same frequency by delivering light through a monolithically integrated waveguide carrying light from the said master laser to the ring laser.

2. The device of claim 1 wherein the semiconductor ring laser is unidirectional.

3. The device of claim 1 having a ridge waveguide structure.

4. The device of claim 1 including an active layer structure comprising at least one quantum-well.

5. The device of claim 1 including an active layer structure comprising quantum dots.

6. The device of claim 1 including an active layer structure comprising a bulk active layer.

7. The device of claim 1 wherein the monolithically integrated waveguide is used to collect light from the master laser by being directly connected to the master laser.

8. The device of claim 1 wherein the master laser comprises a distributed-feedback laser or a distributed-Bragg-reflector laser.

9. The device of claim 1 further including an integrated waveguide directional coupler proximate the ring laser to collect its output.

10. The device of claim 1 wherein the ring laser includes an integrated redirecting waveguide to promote a unidirectional operation of the ring laser.

11. The device of claim 1 further including multiple non-reciprocating curved waveguides branching off from the waveguide between the master laser and the ring laser and used to suppress any optical feedback from the ring laser to the master laser.

12. The device of claim 1 further including a monolithically integrated photodetector located at the backside of the master laser to monitor the emission from the master laser.

13. The device of claim 12 including independent electrical contacts to apply direct injection current to the master laser and integrated waveguides, to apply direct injection current and high-speed current modulation signal to the ring laser, and to apply a reverse bias voltage to the photodetector.

14. The device of claim 1 wherein the ring laser section has a diameter less than 100 microns.

15. A method of injection locking a directly modulated semiconductor ring laser, the method comprising:
providing a semiconductor light-emitting device comprising a semiconductor ring laser monolithically integrated on a common substrate with a single-frequency semiconductor master laser having a frequency-selective element, wherein the light output from the semiconductor master laser is used to injection-lock the semiconductor ring laser to the same frequency by delivering light through a monolithically integrated waveguide carrying light from the master laser to the ring laser;
supplying a direct current bias to the master laser such that the master laser output has a power level sufficient to increase the density of photons inside the semiconductor ring laser;
supplying a direct current bias and a modulated electrical input signal to the semiconductor ring laser for emission of light modulated in response to the input signal; and
selectively tuning the direct bias currents to the master laser and ring laser in order to establish an injection locking mode of operation of the ring laser.

16. The method of claim 15 including adjusting the resonant frequency offset between the master laser and the semiconductor ring laser such as to increase modulation bandwidth of the ring laser.

17. A semiconductor light-emitting device comprising at least two cascaded semiconductor ring lasers monolithically integrated on a common substrate with a single-frequency semiconductor master laser having a frequency-selective element, wherein the light output from the semiconductor master laser is used to injection-lock the first semiconductor ring laser to the same frequency by delivering light through a monolithically integrated waveguide carrying light from the master laser to the first ring laser, with the light output from the first ring laser carried by another monolithically integrated waveguide to the second ring laser, and so on, and all the semiconductor ring lasers are independently addressable by both direct injection current and modulated current signal.

18. The device of claim 1 wherein the monolithically integrated waveguide is used to transfer light from the master laser into the ring laser by means of directional waveguide coupling.

19. The device of claim 1 wherein the monolithically integrated waveguide is used to transfer light from the master laser into the ring laser by being directly connected thereto.

20. The device of claim 1 based on InP/InGaAsP or InP/AlInGaP materials.

21. The device of claim 17 wherein one or more semiconductor ring lasers are unidirectional.

22. The device of claim 17 wherein the light output from one ring laser is delivered to another ring laser by a directional waveguide coupler.

23. The device of claim 17 wherein the ring lasers have their outputs collected by directional waveguide couplers and delivered to subsequent ring lasers by directly connecting the waveguides to the said subsequent ring lasers.

24. The device of claim 17 having a ridge waveguide structure.

25. The device of claim 17 including an active layer structure comprising at least one quantum-well.

26. The device of claim 17 including an active layer structure comprising quantum dots.

27. The device of claim 17 including an active layer structure comprising a bulk active layer.

28. The device of claim 17 based on InP/InGaAsP or InP/AlInGaP materials.

29. The device of claim 17 wherein the master laser comprises a distributed-feedback laser or a distributed-Bragg-reflector laser.

30. The device of claim 17 wherein one or more ring lasers include an integrated redirecting waveguide to promote a unidirectional operation of the ring lasers.

31. The device of claim 17 further including a monolithically integrated photodetector located at a backside of the master laser to monitor emission from the master laser.

32. The device of claim 31 including independent electrical contacts to apply direct injection current to the master laser and integrated waveguides, to apply direct injection currents and high-speed current modulation signals to the ring lasers, and to apply a reverse bias voltage to the photodetector.

33. The device of claim 17 wherein the ring lasers have a diameter less than 100 microns.

* * * * *

UNITED STATES PATENT AND TRADEMARK OFFICE
CERTIFICATE OF CORRECTION

| | | |
|---|---|---|
| PATENT NO. | : 8,009,712 B2 | Page 1 of 1 |
| APPLICATION NO. | : 12/460892 | |
| DATED | : August 30, 2011 | |
| INVENTOR(S) | : Marek A. Osinski et al. | |

It is certified that error appears in the above-identified patent and that said Letters Patent is hereby corrected as shown below:

Column 16, Claim 1, line 39, remove --said-- between "the" and "master".

Signed and Sealed this
First Day of November, 2011

David J. Kappos
*Director of the United States Patent and Trademark Office*